United States Patent [19]

Padwa

[11] Patent Number: 4,731,691
[45] Date of Patent: Mar. 15, 1988

[54] SAFETY CIRCUIT FOR DETECTING ASYMMETRY IN THYRISTOR LOAD CURRENTS

[75] Inventor: Ned Padwa, Tarzana, Calif.
[73] Assignee: National Technical Systems, Calabasas, Calif.
[21] Appl. No.: 871,250
[22] Filed: Jun. 6, 1986
[51] Int. Cl.⁴ .............................................. H02H 3/26
[52] U.S. Cl. ....................................... 361/87; 361/93; 361/187
[58] Field of Search .................. 361/78, 87, 93, 94, 361/102, 111, 160, 170, 187, 205; 307/360

[56] References Cited

U.S. PATENT DOCUMENTS

| | | | |
|---|---|---|---|
| 3,671,761 | 6/1972 | Shibuya et al. | 361/205 |
| 3,886,932 | 6/1975 | Suessmilch | 361/87 |
| 3,976,918 | 8/1976 | Clark | 361/87 X |
| 4,020,394 | 4/1977 | Potash | 361/87 X |
| 4,295,177 | 10/1981 | Woodhouse et al. | 361/194 |
| 4,346,424 | 8/1982 | Hansen | 361/87 X |

*Primary Examiner*—Philip H. Leung
*Assistant Examiner*—Jeffrey A. Gaffin
*Attorney, Agent, or Firm*—Marvin H. Kleinberg; Matthew F. Jodziewicz

[57] ABSTRACT

A symmetry sensing safety circuit for automatically stopping electrical current flow through a thyristor to an electrical device which is supplied by a source of alternating current electrical energy. The symmetry sensing safety circuit includes a current sensing circuit operatively associated in series with the thyristor and the electrical device for sensing the electrical current flow; an amplifier circuit operatively associated with the current sensing circuit for generating a signal which is proportional to the amplitude and direction of the sensed electrical current flow; an integrating circuit operatively associated with the amplifier circuit for generating a signal which is proportional to the amplitude and direction of the signal generated by the amplifier circuit integrated over a predetermined time interval; a comparison circuit operatively associated with the integrating circuit for generating a signal indicating when the signal generated by the integrating circuit is outside of a predetermined range of values; a relay control circuit operatively associated with the comparison circuit for generating a triggering signal whenever the comparison circuit generates the signal indicating the signal generated by the integrating circuit is outside of the predetermined range of values; an electromechanical relay operatively associated with the relay control circuit and with the source of electrical energy for switching on and off the electrical current flow to the thyristor in response to the triggering signal.

19 Claims, 2 Drawing Figures

SAFETY CIRCUIT FOR DETECTING ASYMMETRY IN THYRISTOR LOAD CURRENTS

BACKGROUND OF THE INVENTION

1. Field of the Invention

This invention relates in general to safety circuits for detecting asymmetry in load currents and de-energizing the load circuit when asymmetry is detected, and more particularly, to a safety circuit that is useful with a triac to cut off load current flow through the triac when it detects asymmetrical load current through the triac.

2. Description of the Related Art

With the development of semiconductor switching devices it became evident that some safety means must be developed to safeguard both the switching device and the associated load from asymmetries in the load current that would otherwise damage or destroy both of these devices.

The need for the development of a safety means became especially important with the use of a class of discrete semiconductor switching devices classified as thyristors. The two most important subclassifications of thyristors for use in understanding the preferred embodiment of the invention disclosed and claimed herein, are the silicon reverse-controlled blocking thyristor or silicon controlled rectifier (SCR) as it is commonly known, and the bidirectional triode thyristor or triac as it is commonly known.

Thyristors are generally used as switching devices to deliver unidirectional load currents that do not require any control current once they are switched on. Normally, all that is required to switch them on is a quick triggering pulse to a control gate, after which, even if the triggering pulse is removed, the thyristor continues to conduct its load current. Typically, they cannot be turned off by means of a control current, so they cannot be controlled continuously, as a transistor can. In fact, they normally cease conduction only when the load current itself stops. It is this latter characteristic of a thyristor that can cause problems when a triac is used as a switching device in an alternating current circuit. Since the current goes to zero, shutting off the triac at the end of each half-cycle, the triac must be re-triggered every half cycle, there is the possibility that the triac will be triggered into conduction on one-half of the applied alternating current cycle and not on the other half of the cycle. The result of this malfunction would be to apply voltage with a significant direct current component to the system load. When the system load is, for example, a fluorescent lighting system, it is essentially inductive in its characteristics. Applying a significant direct current voltage component to an inductive load of this type can cause overcurrents and overheating. Where the lighting system ballasts do not incorporate thermal cut-out devices, the overheating may permanently damage the ballasts. The safety means of the present invention was developed to detect such half-cycle operation by a switching device such as a triac and to effectively cut off the power to the system load in the event of its occurrence.

SUMMARY OF THE INVENTION

It is an object of the invention to provide a symmetry sensing safety circuit means for use with a thyristor such as a triac to automatically detect asymmetrical thyristor operation.

It is an object of the invention to provide a symmetry sensing safety circuit means for use with a thyristor such as a triac that is insensitive to short term load current transients that would otherwise trigger the symmetry sensing safety circuit means of the invention.

It is an object of the invention to provide a symmetry sensing safety circuit means for use with a thyristor such as a triac wherein the sensitivity to asymmetry of the safety circuit means can be adjusted.

It is an object of the invention to provide a symmetry sensing safety circuit means for use with a thyristor such as a triac wherein the safety circuit means cuts off the power to the system load and automatically latches the system in the power off state until manually reset.

It is an object of the invention to provide a symmetry sensing safety circuit means for use with a thyristor such as a triac wherein the action of the safety circuit means is independent of the type of system load.

It is an object of the invention to provide a symmetry sensing safety circuit means for use with a thyristor such as a triac wherein the action of the safety circuit means is independent of which half-cycle of the load current the malfunction or asymmetry occurs.

It is an object of the invention to provide a symmetry sensing safety circuit means for use with a thyristor such as a triac wherein the action of the safety circuit is independent of the cause of the malfunction.

It is an object of the invention to provide a symmetry sensing safety circuit means for use with a thyristor such as a triac which uses common, readily available parts and is economical and maintenance free in operation.

A preferred embodiment of an apparatus built in accordance with the invention disclosed herein, for controlling electrical current flow through a thyristor to an electrical device which is supplied by a source of alternating electrical energy, comprises: current sensing means operatively associated in series with the thyristor and the electrical device for sensing the electrical current flow; amplifier circuit means operatively associated with the current sensing means for generating a signal which is proportional to the amplitude and direction of the sensed electrical current flow; integrating circuit means operatively associated with the amplifier circuit means for generating a signal which is proportional to the asymmetry of the power content of the signals of respective positive and negative polarity generated by the amplifier circuit means integrated over a predetermined time interval; comparison circuit means operatively associated with the integrating circuit means for generating an error signal indicating when the signal generated by the integrating circuit means is outside of a predetermined range of values; relay control circuit means operatively associated with the comparison circuit means for generating a triggering signal in response to the error signal; electromechanical relay means operatively associated with the relay control circuit means and with the source of electrical energy for switching on and off the electrical current flow to the thyristor in response to the triggering signal.

Another preferred embodiment of an apparatus built in accordance with the invention disclosed herein comprises: a current sensing resistor device having a low resistance, serially connected to the thyristor and to the source of electrical energy for sensing the electrical current flow; differential amplifier circuit means operatively associated with the resistor device for generating a signal which is proportional to the amplitude and direction of the sensed electrical current flow; integrating circuit means operatively associated with the differential amplifier means for generating a signal which is proportional to the amplitude and direction of the signal generated by the differential amplifier circuit means integrated over a predetermined time interval, the time interval being variable by a user, the integrating circuit means having a time constant of at least 0.5 seconds; window comparator circuit means operatively associated with the integrating circuit means for generating an error signal indicating when the signal generated by the integrating circuit means is outside of a predetermined range of values, the range of values being user adjustable; relay control circuit means operatively associated with the window comparator circuit means for generating a triggering signal in response to the error signal; electromechanical relay means operatively associated with the relay control circuit means and with the source of electrical energy for switching on and off the electrical current flow to the thyristor in response to the triggering signal; latching circuit means operatively associated with the electromechanical relay means for latching, in a selectively releasable manner, the electromechanical relay means in the state switching off the electrical current flow to the thyristor.

In a first alternate preferred embodiment of the device described immediately above, the latching circuit means is manually releasable and includes a manual reset button.

In a second alternate preferred embodiment of the device described above, the latching circuit means automatically releases the electromechanical relay means from the latched state after a predetermined reset time interval and the predetermined reset time interval is selectively variable by the user.

The novel features of construction and operation of the invention will be more clearly apparent during the course of the following description, reference being had to the accompanying drawings wherein has been illustrated a preferred form of the device of the invention and wherein like characters of reference designate like parts throughout the drawings.

DESCRIPTION OF THE PREFERRED EMBODIMENTS

Figure 1:
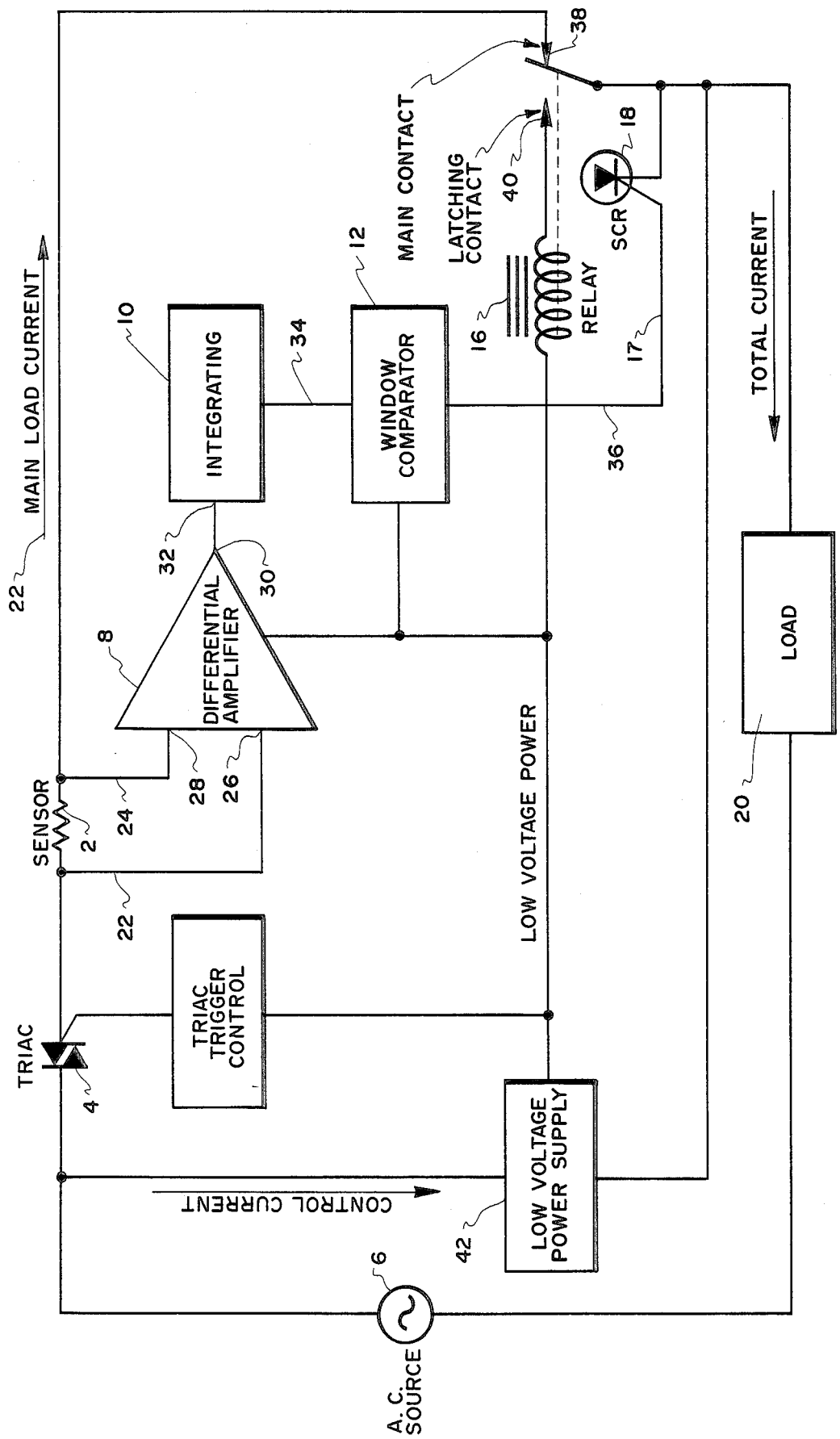
FIG. 1 is a block diagram of which broadly sets forth the present invention.
Figure 2:
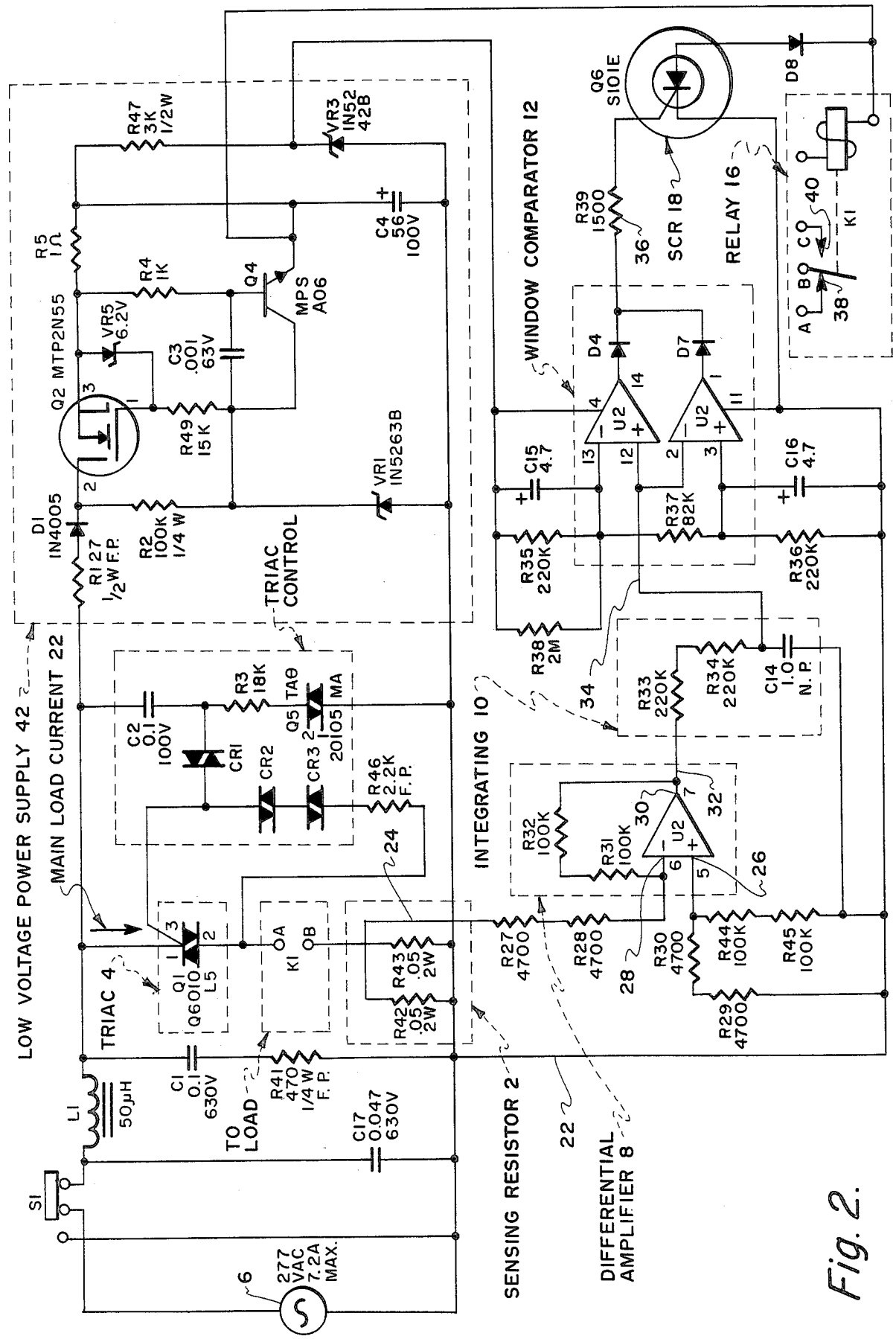
FIG. 2 is a schematical illustration of circuitry made in accordance with the preferred embodiment of the present invention.

In FIG. 1 there is disclosed a block diagram which broadly sets forth circuitry for detecting asymmetry in current flow through a thyristor, which circuitry is more particularly illustrated in FIG. 2. The circuitry cuts off the current flow whenever asymmetry beyond a predetermined level is detected. The circuitry includes a current sensing means 2, preferably a low valued resistor device serially connected to a triac 4 and to a source of alternating current electrical energy 6. The main load current, indicated by arrow 22, flows through resistor 2 creating a small voltage drop and a very slight power loss to the system due to the low value of resistor 2. System load 20 is powered from source through triac 4.

Leads 22, 24, from both sides of resistor 2 are connected respectively to the inputs 26, 28, of a differential amplifier circuit 8. The differential amplifier circuit 8 senses the direction and amplitude of the main load current 22 flowing through resistor 2. The output 30 of differential amplifier circuit 8 is processed as an input 32 to an integrating circuit 10.

Integrating circuit 10 delivers as an output 34, a voltage approximately equal to zero as long as output signal 30 from differential amplifier circuit 8 is relatively symmetrical with respect to its positive and negative excursions during the period of integration. If the main load current 22 delivered to system load during the period chosen for integrating becomes unequal or asymmetrical, the output 34 of integrating circuit 10 will be shifted in the direction of the dominant side of the asymmetry by an amount relative to the degree of asymmetry.

While it is preferable that integrating circuit 10 have its period for integrating selectively adjustable by a user, it should always include an integral number of load current cycles in circuits having a frequency of operation of less than 50 Hz.

To avoid unnecessary triggering of the safety circuitry of the invention, integrating circuit 10 has a time constant of at least 0.5 second. This will render the circuitry relatively immune to noise spikes and similar short term transient asymmetries of the line voltage itself.

Integrating circuit 10 is operatively associated with a window comparator circuit 12 which is a circuit that accepts the integrated signal output 34 of integrating circuitry 10 and changes the output state of its signal 36 when its input signal (here the integrated signal output 34 of integrating circuitry 10) varies beyond certain preset positive and negative limits established with respect to a predetermined reference operatively associated with window comparator circuit 12. Thus, window comparator circuit 12 will change the output state of its signal 36 only when the integrated signal 34 of integrating circuit 10 strays a predetermined amount either side of zero. This condition will occur only when a sustained asymmetry of unacceptable amplitude is detected in main load current 22.

Once a sustained asymmetry of unacceptable amplitude is detected in main load current 22, power from source 6 is cut off to system load 20 as described below.

While it is possible to cut off a triac in an alternating current circuit by removing power from its gate, in the preferred embodiment of the invention this is not done, as the triac itself could be malfunctioning and causing the asymmetry in the main load current. It is also possible that such a malfunctioning triac would not respond normally to shutting off its gate power and damage to the system load would occur.

Accordingly, to avoid this possibility, an electromechanical relay 16 is used to cut off main load current 22 by opening the circuit from triac 4 to system load 20 when asymmetry is detected in main load current 22.

An electromechanical relay is preferable to a semiconductor device, because a semiconductor device, such as a second triac which may be placed in series with the first triac for power cut off, would generate a significant amount of heat. As heat dissipation is a primary concern in the design of semiconductor devices, the use of an electromechanical relay is preferred as it generates little to no heat while in operation.

Under normal operation, main load current 22 flows from triac 4 through the normally closed contacts 38 of relay 16 and then to system load 20. Relay 16 is normally de-energized, consuming no power and generating no heat. When window comparator 12 changes the output state of its signal 36, this change acts as a triggering pulse to gate 17 of a silicon controlled diode (SCR) 18, which, in turn, activates relay 16, opening the normally closed contacts 38 and cutting off main load current 22.

A second set of normally open contacts 40 then latches relay 16, in the non-conducting state, keeping main load current 22 cut off until a user turns off the main source of power 6 to the system. With the main power off, relay 16 will unlatch, and normally closed contacts 38 will once again make contact and the safety circuit of the invention will be reset.

FIG. 1 also shows how a low voltage power supply 42 is connected to the system components and the source of alternating current electrical power 6, to provide the necessary power to operate the system.

FIG. 2 is a generalized, but more specific than FIG. 1, schematic of circuitry for detecting asymmetry in current flow embodying a preferred form of the present invention wherein the same reference numerals and arrows used in FIG. 1 are also used to better illustrate possible internal circuitry of the operational blocks of FIG. 2.

The invention described above is, of course, susceptible to many variations, modifications and changes, all of which are within the skill of the art. It should be understood that all such variations, modifications and changes are within the spirit and scope of the invention and of the appended claims. Similarly, it will be understood that it is intended to cover all changes, modifications and variations of the example of the invention herein disclosed for the purpose of illustration which do not constitute departures from the spirit and scope of the invention.

I claim:

1. A symmetry sensing safety circuit means controlling an alternating electrical current flow through a bidirectional triode thyristor having its main terminals serially connected to an electrical device and to a source of electrical energy, the symmetry sensing safety circuit means having sensors connected in series and control logic connected in parallel with the thyristor, comprising:
   a current sensing resistor device having a low resistance serially connected to thyristor and to the source of electrical energy sensing the alternating electrical current flow;
   differential amplifier circuit means operatively associated with said resistor device generating a signal which is indicative of the direction and proportional to the amplitude of the sensed electrical current flow;
   integrating circuit means operatively associated with said differential amplifier means generating a signal which is indicative of the direction and proportional to the amplitude of said signal generated by said differential amplifier circuit means integrated over a predetermined time interval, said time interval being variable by a user, said integrating circuit means having a time constant of at least 0.5 seconds;
   window comparator circuit means operatively associated with said integrating circuit means generating a signal indicating when said signal generated by said integrating circuit means is outside of a predetermined range of values, said range of values being user adjustable;
   relay control circuit means operatively associated with said window comparator circuit means generating a triggering signal whenever said window comparator circuit means generates said signal indicating said signal generated by said integrating circuit means is outside of said predetermined range of values;
   electromechanical relay means operatively associated with said electromechanical relay means latching, in a selectively releasable manner, said electromechanical relay means in said latched state switching off the alternating current flow to the thyristor.

2. A symmetry sensing safety circuit means in accordance with claim 1 wherein said latching circuit means is manually releasable and includes a manual reset button.

3. A symmetry sensing safety circuit means in accordance with claim 1 wherein said latching circuit means automatically releases said electromechanical relay means from said latched state after a predetermined reset time interval.

4. A symmetry sensing safety circuit means in accordance with claim 3 wherein said predetermined reset time interval is selectively variable by said user.

5. A symmetry sensing safety circuit means controlling electrical current flow through a thyristor to an electrical device which is in parallel with a source of electrical energy, the symmetry sensing safety circuit comprising:
   current sensing means operatively associated in series with the thyristor and the electrical device sensing the electrical current flow;
   amplifier circuit means operatively associated with said current sensing means generating a signal which is indicative of the direction and proportional to the amplitude of said signal generated by said amplifier circuit means integrated over a predetermined time interval;
   comparison circuit means operatively associated with said integrating circuit means generating a signal indicating when said signal generated by said integrating circuit means is outside of a predetermined range of values;
   relay control circuit means operatively associated with said comparison circuit means generating a triggering signal whenever said comparison circuit means generates said signal indicating said signal generated by said integrating circuit means is outside of a predetermined range of values;
   electromechanical relay means operatively associated with said relay control circuit means and with the source of electrical energy switching on and off the electrical current flow to the thyristor in response to said triggering signal.

6. A symmetry sensing safety circuit means in accordance with claim 5 wherein said current sensing means is a resistor device having low resistance operatively associated in series with the thyristor and the electrical current flow.

7. A symmetry sensing safety circuit means in accordance with claim 5 wherein said predetermined time interval over which the amplitude and direction of said signal generated by said differential amplifier circuit means is integrated, can be selectively varied, but includes an integral number of electrical current cycles.

8. A symmetry sensing safety circuit means in accordance with claim 5 wherein said integrating circuit means has a time constant of at least 0.5 second.

9. A symmetry sensing safety circuit means in accordance with claim 5 wherein said comparison circuit means is a window comparator circuit.

10. A symmetry sensing safety circuit means in accordance with claim 5 wherein said predetermined range of values used by said comparison circuit means is selectively variable.

11. A symmetry sensing safety circuit means in accordance with claim 5, further including:
   latching circuit means operatively associated with said electromechanical relay means latching, in a selectively releasable manner, said electromechanical relay means in said latched state switching off the electrical current flow to the thyristor.

12. A symmetry sensing safety circuit means in accordance with claim 11 wherein said latching circuit means is manually releasable.

13. A symmetry sensing safety circuit means in accordance with claim 11 wherein said latching circuit means automatically releases said electromechanical relay means from said latched state after a predetermined reset time interval.

14. A symmetry sensing safety circuit means in accordance with claim 13 wherein said predetermined reset time interval is selectively variable.

15. A symmetry sensing safety circuit means in accordance with claim 5 wherein said amplifier means comprises a differential amplifier circuit means.

16. A symmetry sensing safety circuit means in accordance with claim 5 wherein the thyristor is a bidirectional triode thyristor having its main terminals serially connected to the electrical device and to the source of electrical energy.

17. A symmetry sensing safety circuit means in accordance with claim 5 wherein the source of electrical energy is an alternating current.

18. A method of detecting and acknowledging asymmetry in a load current flow, comprising the steps of:
   sensing said load current flow;
   generating a first signal which is proportional to the amplitude and direction of said sensed load current flow;
   generating a second signal which is proportional to the amplitude and direction of said first signal integrated over a predetermined interval of time;
   comparing said second signal to a predetermined range of values and generating a trigger signal whenever said second signal is outside of said range of values;
   actuating an electromechanical relay means operatively associated with said load current flow by means of said trigger signal to disable said load current flow.

19. A method of protecting a bidirectional triode thyristor from excessive asymmetrical flow of alternating load current therethrough, comprising the steps of:
   sensing the load current flow;
   generating a first signal indicative of the direction and amplitude of the sensed current flow;
   integrating said first signal over a predetermined interval of time corresponding to a predetermined number of current alterations so as to produce an integrated signal indicative of the asymmetry of the current flow during said predetermined interval of time;
   comparing said integrated signal to a predetermined range of values to produce a comparison signal;
   whenever said comparison signal indicates that said integrated signal is outside said predetermined range of values, producing a trigger signal; and,
   in response to the trigger signal, shutting off the flow of load current to the thyristor.

* * * * *